(12) United States Patent
Nagashima et al.

(10) Patent No.: US 10,718,731 B2
(45) Date of Patent: Jul. 21, 2020

(54) CELL FOR ELECTROCHEMICAL MEASUREMENT

(71) Applicant: TOYOTA JIDOSHA KABUSHIKI KAISHA, Toyota-shi, Aichi-ken (JP)

(72) Inventors: Shinya Nagashima, Toyota (JP); Toshihiro Ikai, Okazaki (JP); Hisao Kato, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 77 days.

(21) Appl. No.: 16/138,138

(22) Filed: Sep. 21, 2018

(65) Prior Publication Data
US 2019/0107504 A1   Apr. 11, 2019

(30) Foreign Application Priority Data

Oct. 5, 2017  (JP) .................................. 2017-195024

(51) Int. Cl.
| | | |
|---|---|---|
| *G01N 27/403* | (2006.01) | |
| *G01Q 60/22* | (2010.01) | |
| *G01N 27/30* | (2006.01) | |
| *H01J 37/20* | (2006.01) | |
| *G01N 23/04* | (2018.01) | |
| *G01N 27/416* | (2006.01) | |

(Continued)

(52) U.S. Cl.
CPC ............ *G01N 27/30* (2013.01); *G01N 23/04* (2013.01); *G01N 27/403* (2013.01); *G01N 27/416* (2013.01); *G01Q 60/22* (2013.01); *H01J 37/20* (2013.01); *H01J 37/26* (2013.01); *G01Q 80/00* (2013.01); *H01J 2237/2003* (2013.01); *H01J 2237/2008* (2013.01)

(58) Field of Classification Search
CPC ........ G01Q 80/00; G01Q 90/00; G01Q 60/16; G01Q 60/22; G01N 27/403; G01N 27/416
See application file for complete search history.

(56) References Cited

U.S. PATENT DOCUMENTS

2018/0136148 A1* 5/2018 Zhang .................... B01L 3/508

FOREIGN PATENT DOCUMENTS

JP            2013-200123 A    10/2013

OTHER PUBLICATIONS

EPO computer-generated English language translation of the Description section of Igai Toshihireo JP 2013-00123 A , which was published Oct. 3, 2013 (Year: 2013).*

* cited by examiner

*Primary Examiner* — Alexander S Noguerola
(74) *Attorney, Agent, or Firm* — Oliff PLC

(57) ABSTRACT

A cell for electrochemical measurement is a cell for electrochemical measurement used for measurement by an electron beam that passes through an observation window, a MEMS chip for observation which includes a laminate including an electron-transmissive thin film and a substrate and in which a working electrode and a counter electrode are provided on a thin film and an MEMS chip for sealing which is a laminate including an electron-transmissive thin film and a substrate are disposed apart from each other, and there are areas in both laminates in which the substrates are not present, and an observation window including the thin film is formed in the areas, and the working electrode overlaps the observation window in both laminates and has a plurality of through-holes on an observation window in a direction in which an electron beam passes.

5 Claims, 5 Drawing Sheets

(51) Int. Cl.
*H01J 37/26* (2006.01)
*G01Q 80/00* (2010.01)

CELL FOR ELECTROCHEMICAL MEASUREMENT

INCORPORATION BY REFERENCE

The disclosure of Japanese Patent Application No. 2017-195024 filed on Oct. 5, 2017 including the specification, drawings and abstract is incorporated herein by reference in its entirety.

BACKGROUND

1. Technical Field

The present disclosure relates to a cell for electrochemical measurement used in an electrochemical measurement system for observing an electrochemical change in a sample.

2. Description of Related Art

Knowing mechanisms of synthesis, activity, and degradation of a catalyst used in a fuel cell and the like is an important guide in developing a novel catalyst. Therefore, for observing an electrochemical change in an electrode catalyst for a fuel cell such as a Pt catalyst as a sample in real time, in particular, a cell for electrochemical measurement used when in-situ observation is performed under a transmission electron microscope (TEM) is being developed.

For example, Japanese Unexamined Patent Application Publication No. 2013-200123 (JP 2013-200123 A) discloses a cell for electrochemical measurement that includes a substrate composed of an electron beam transmissive thin film and a stiffened plate, a pair of electrodes composed of a gold electrode and a platinum electrode disposed on the thin film of the substrate, a surrounding frame that surrounds the pair of electrodes on the thin film, an electrolytic solution for sealing the pair of electrodes in a space on the thin film surrounded by the surrounding frame, and a lid which is disposed above the surrounding frame and composed of an electron beam transmissive thin film and a stiffened plate, wherein both stiffened plates of the lid and the substrate are hollowed at positions corresponding to the gold electrode and form observation windows, a sample in contact with the gold electrode can be observed from the observation window, and an electron beam can pass through the corresponding observation windows and the sample therebetween. In such a configuration, it is possible to perform both electrochemical measurement and sample observation, and it is possible to observe an electrochemical change in an electrode catalyst for a fuel cell, for example, a Pt catalyst, in real time.

FIG. 5 shows an example of a configuration of a cell for electrochemical measurement of the related art. A cell for electrochemical measurement 5 in FIG. 5 includes a laminate (a micro electro mechanical systems (MEMS) chip for sealing 5a) composed of an electron-transmissive thin film 50a with a thickness of several tens of nm and made of silicon nitride (SiN), and a substrate 51a, and a MEMS chip for observation 5b in which a working electrode 52 and a counter electrode (not shown) are provided on the thin film 50b are disposed, which MEMS chip for observation 5b includes a laminate similarly composed of an electron-transmissive thin film 50b and a substrate 51b. The chips 5a and 5b are separated by a thickness $d_1$ with a spacer (not shown) or the like therebetween. In the cell for electrochemical measurement 5, an electrolytic solution E is sealed by two MEMS chips including the MEMS chip for observation 5b and the MEMS chip for sealing 5a, and an electrochemical reaction is caused when a voltage is applied between the working electrode 52 and the counter electrode in the MEMS chip for observation 5b. In both MEMS chips, there are areas without substrates 51a and 51b, and observation windows 53a and 53b composed of the thin films 50a and 50b are formed in those areas. The working electrode 52 is positioned so that it overlaps the observation windows 53a and 53b, and by an electron beam B that passes through the observation windows 53a and 53b, a sample S (the sample S is actually in contact with the entire surface of the working electrode 52) such as a catalyst, which is in contact with an end of the working electrode 52, or the working electrode 52 itself can be observed.

FIG. 5 shows an ideal state. Actually, as shown in FIG. 6, the observation windows 53a and 53b made of SiN or the like are pulled outward due to a high vacuum inside a TEM device and bowed, and a phenomenon in which a liquid layer through which the electron beam B passes becomes thicker according to an amount of bowing (a thickness $d_2$ at maximum) occurs. Therefore, there is a problem of an observation image being blurred due to the thick liquid layer.

Here, since amounts of bowing of the observation windows 53a and 53b are minimum at peripheral parts, if, as shown in FIG. 7, the end of the working electrode 52 is retracted to the peripheral part of the observation window 53b, the electron beam B is allowed to pass through an area in which the thickness of the liquid layer is d1, and it is possible to observe the sample S and the working electrode 52 while blurring of the observation image is minimized.

However, since the size of the cell for electrochemical measurement is very small, as shown in FIG. 8, when two MEMS chips overlap, positional displacement between ends of the observation windows 53a and 53b occurs due to play during assembly or the like. Alternatively, when an electrode such as the working electrode 52 is formed, positional displacement occurs. In such a case, when the end of the working electrode 52 is retracted to the peripheral part of the observation window 53b, a case in which the sample S in contact with the working electrode 52 cannot be observed by using the electron beam B that has passed through the observation window 53a is assumed. Therefore, eventually, as shown in FIG. 6, the end of the working electrode 52 is disposed so that it enters the inside of the observation window 53b by a compensation amount of positional displacement, and there is no choice but to accept blurring of the observation image caused by bowing of the observation windows 53a and 53b.

SUMMARY

As described above, in the related art, it is difficult to dispose the end of the working electrode according to a part in which an amount of bowing of the observation window is small and the thickness of the liquid layer is small.

Thus, the present disclosure provides a cell for electrochemical measurement in which a part in which an amount of bowing of an observation window is small and a liquid layer is thinnest can be used as a part in which a sample in contact with a working electrode is observed, and accordingly, high resolution observation can be realized.

The inventors conducted extensive studies and as a result, found that, when an electrode shape (Hall array) having a plurality of through-holes is adopted for a working electrode, it is possible to position an end of the working electrode at a part in which the thickness of a liquid layer is thin, thereby completing the disclosure. That is, the present disclosure is summarized as follows.

(1) A cell for electrochemical measurement used for measurement by an electron beam that passes through an observation window, including: a MEMS chip for observation; and a MEMS chip for sealing, wherein the MEMS chip for observation includes a laminate including an electron-transmissive thin film and a substrate and in the MEMS chip for observation a working electrode and a counter electrode are provided on the thin film and the MEMS chip for sealing is a laminate including an electron-transmissive thin film and a substrate, and the MEMS chip for observation and the MEMS chip for sealing are disposed apart from each other, and there are areas in both laminates in which the substrates are not present, and an observation window including the thin film is formed in the areas, and the working electrode overlaps the observation window in both laminates, and has a plurality of through-holes on the observation window in a direction in which an electron beam passes.

(2) The cell for electrochemical measurement according to (1), wherein a planar shape of the through-holes on a plane perpendicular to a hole-axis direction of the through-holes may be a circle.

(3) The cell for electrochemical measurement according to (1) or (2), wherein a proportion of a total area of the plurality of through-holes in an external shape area of the working electrode on a plane perpendicular to a hole-axis direction of the through-holes may be 10% to 90%.

(4) A MEMS chip for observation including a laminate including an electron-transmissive thin film and a substrate, wherein there is an area of the laminate in which the substrate is not present, an observation window including the thin film is formed in the area, a working electrode and a counter electrode are provided on the thin film, and the working electrode overlaps the observation window and has a plurality of through-holes on the observation window.

According to the cell for electrochemical measurement of the present disclosure, a part in which an amount of bowing of an observation window is small and a liquid layer is thinnest can be used as a part in which a sample is observed, and accordingly, high resolution observation can be realized.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
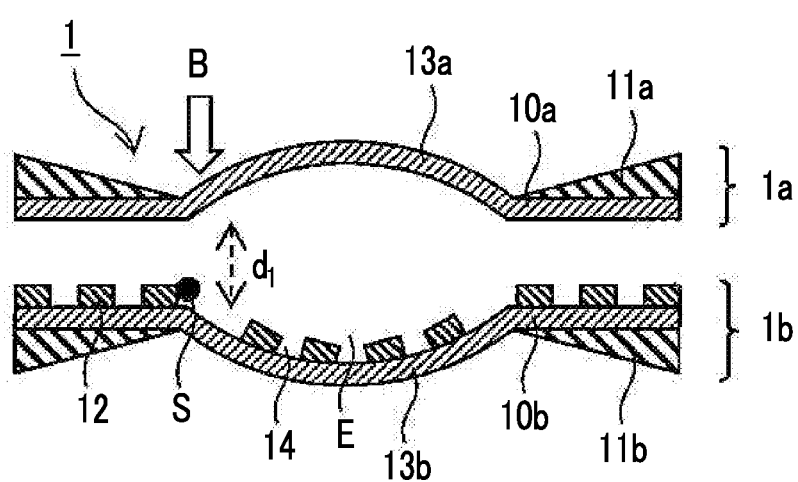
FIG. 1 is a cross-sectional view of a cell for electrochemical measurement according to an embodiment of the present disclosure.

The present disclosure will be described below in detail with reference to embodiments. FIG. 1 is a cross-sectional view of an embodiment of a cell for electrochemical measurement according to the present disclosure. A cell for electrochemical measurement 1 in FIG. 1 includes a pair of chips, i.e., a laminate (a MEMS chip for sealing 1a) composed of an electron-transmissive thin film 10a and a substrate 11a, and a MEMS chip for observation 1b in which a working electrode 12 and a counter electrode (not shown) are provided on the thin film 10b, which MEMS chip for observation 1b includes a laminate similarly composed of an electron-transmissive thin film 10b and a substrate 11b. The chips 1a and 1b are separated by a spacer (not shown) therebetween. Thus, there are areas in both laminates in which the substrates 11a and 11b are not present, and observation windows 13a and 13b composed of the thin films 10a and 10b are formed in those areas. Here, FIG. 1 shows a state when the cell for electrochemical measurement 1 is attached to a transmission electron microscope (TEM) and actually used, an electrolytic solution E is sealed between the thin film 10a and the thin film 10b, and the observation windows 13a and 13b are pulled outward and bowed because the outside of the cell for electrochemical measurement 1 is in a high vacuum. Examples of the electrolytic solution E include perchloric acid, sulfuric acid, and nitric acid, but the present disclosure is not limited thereto.

Both of the thin films 10a and 10b are ultra thin films with a thickness of about several nm to 100 nm, and can seal the electrolytic solution E, and can be made of various electron-transmissive materials. For example, silicon nitride, silicon dioxide, and amorphous silicon can be exemplified. Silicon nitride is preferable.

In addition, the substrates 11a and 11b have a thickness of about several μm to 500 μm, and have a function of reinforcing the thin films 10a and 10b. Examples of materials constituting the substrates 11a and 11b include silicon, but the present disclosure is not limited thereto.

The planar size of the cell for electrochemical measurement 1 is about several mm square, and the spacer can be made of a resist film or a ceramic material such as silicon dioxide. When the spacer is formed of a rubber material for sealing, since there is a risk of rubber being melted and components of the electrolytic solution E being changed, a resist film or a ceramic material is preferably used.

The thicknesses of the working electrode 12 and the counter electrode are about several nm to several μm, and materials of these electrodes vary according to a type of the electrolytic solution E, a sample S to be measured, or the like. The sample S to be measured is, for example, an electrode catalyst made of platinum for a fuel cell or an alloy thereof, but it should be noted that the present disclosure is not limited thereto.

At least some of the working electrode 12 overlaps the observation windows 13a and 13b, and the working electrode 12 can be observed through the observation window 13a. The sample S to be measured comes in contact with the working electrode 12, and an electrochemical change in the sample S when a voltage is applied between the pair of electrodes can be observed by using an electron beam B that passes through the observation window 13a and passes through the sample S and the observation window 13b. Here, for convenience, FIG. 1 shows that one particle of the sample S is in contact with a part of the working electrode 12. However, actually, the sample S is over the entire working electrode 12, and is in contact with not only an end of the working electrode 12 but also an upper surface of the working electrode 12. However, the sample S in contact with the upper surface of the working electrode 12 cannot be observed because the electron beam is blocked by the working electrode 12, and only the sample S that is exposed to the end of the working electrode 12 when viewed through the observation windows 13a and 13b can be observed as shown in FIG. 1. In addition, the working electrode 12 itself may be an observation target.

In the present embodiment, in the working electrode 12, a plurality of through-holes 14 are provided on the observation window 13b in a direction in which an electron beam B passes. Thus, since the number of parts corresponding to the end of the working electrode that can be observed through the observation windows 13a and 13b is large, any end of the working electrode 12 can be reliably positioned at a part in which the thinnest thickness (amounts of bowing of the observation windows 13a and 13b are smallest) of a liquid layer of the electrolytic solution E is $d_1$ or in the vicinity thereof. Therefore, since the sample S in contact with the end of the working electrode 12 can be observed through the part in which the liquid layer of the electrolytic solution E is thinnest, blurring of the observation image is minimized and high resolution observation is possible. In this case, even if there is slight positional displacement between two laminates, since the end (the outer circumference of the through-holes 14) of the working electrode 12 and peripheral parts (or the vicinity thereof) of the observation windows 13a and 13b can be reliably formed, it is possible to improve the resolution compared to the related art.

Figure 2A:
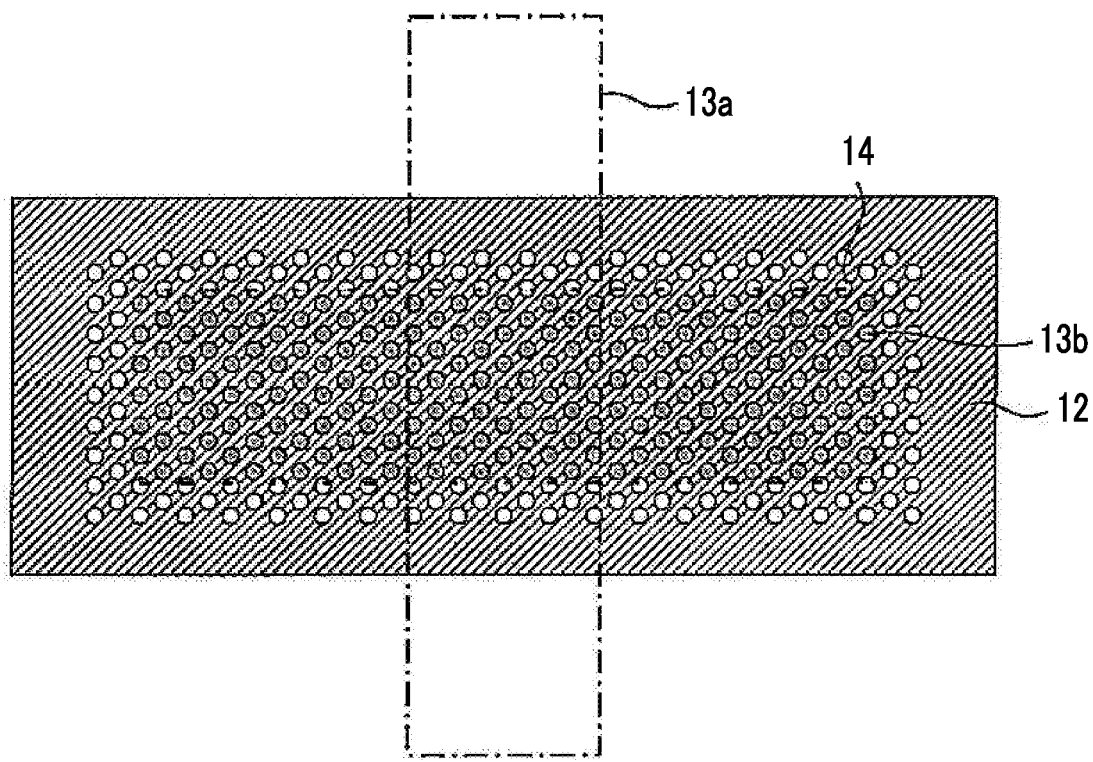
FIG. 2A is a plan view of only an observation window 13b, a working electrode 12 and an observation window 13a among components of a cell for electrochemical measurement 1 in FIG. 1.
Figure 2B:
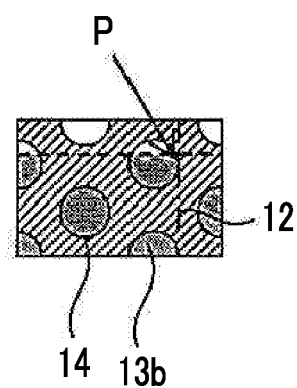
FIG. 2B is an enlarged view of a peripheral part of the observation window 13b in FIG. 2A.

For convenience, FIG. 2A is a plan view of only the observation window 13b, the working electrode 12 and the observation window 13a among components of the cell for electrochemical measurement 1 in FIG. 1, and FIG. 2B is an enlarged view of the peripheral part of the observation window 13b in FIG. 2A. As shown in FIG. 2A and FIG. 2B, the plurality of through-holes 14 are provided in the working electrode 12, external shapes of the observation window 13a, the working electrode 12, and the observation window 13b are, for example, rectangles, and the observation window 13a and the observation window 13b can be disposed so that their long sides are perpendicular to each other. Since a part indicated by an arrow P is a peripheral part of the observation window 13a and the observation window 13b and is the end (the outer circumference of the through-holes 14) of the working electrode 12, when an electron beam is caused to pass through the part or the vicinity thereof, it is possible to observe the sample S in contact with the working electrode 12 or the working electrode 12 itself with a high resolution.

A planar shape of the through-holes 14 on a plane perpendicular to a hole-axis direction of the through-holes 14 in the working electrode 12 is not particularly limited, and can be, for example, a circle. When the through-holes 14 are circular, the diameter of the circle can be, for example, 1 μm to 10 μm.

In addition, on a plane perpendicular to a hole direction-axis of the through-holes 14 in the working electrode 12, a proportion of a total area of the plurality of through-holes 14 in the external shape area of the working electrode 12 is appropriately set in consideration of formation of a large number of ends of the working electrode 12 and the like. For example, the proportion is preferably within a range of 10% to 90%.

While the planar shape of the through-holes 14 is a circle in the present embodiment, the present disclosure is not limited thereto. The through-holes may have other shapes such as a parallelogram and a square or a slit-like through-hole that is long in one direction may be used. In addition, the density (pitch) of the through-holes 14 may be changed at positions on the working electrode 12 for formation.

The above cell for electrochemical measurement 1 is fixed to a tip of a holder and is installed in a transmission electron microscope, and a electrochemical change in the sample S is observed through a CCD camera and the like constituting the transmission electron microscope.

While the present disclosure will be described below in further detail with reference to examples, the present disclosure is not limited thereto.

Production of Cell for Electrochemical Measurement and Observation Under Transmission Electron Microscope First, on a silicon substrate, a silicon nitride (SiN) film as a thin film, a counter electrode made of platinum, a working electrode made of gold, and a spacer were formed using photoresist technology, and thereby a MEMS chip for observation was produced. Next, the Si substrate on the back side of the SiN film was partially dissolved, and an observation window made of SiN was formed. Here, in the example, a working electrode in which a plurality of circular through-holes were formed was disposed so that it overlapped the observation window. A proportion of a total area of the through-holes in the external shape area of the working electrode was 16%. In addition, in a comparative example, a working electrode without a plurality of through-holes on an observation window was disposed so that it overlapped the observation window. Next, a sample of a Pt catalyst was applied to the observation windows made of SiN of the example and the comparative example.

Separately, a laminate (a MEMS chip for sealing) composed of a Si substrate and a SiN film was produced, the Si substrate was partially dissolved and an observation window made of SiN was formed, which was disposed in a transmission electron microscope holder with the SiN film at the top, and a perchloric acid electrolytic solution was injected onto the SiN film. Next, in order to seal the electrolytic solution from above, a laminate (MEMS chip for observation) composed of a Si substrate and a SiN thin film while the sample was in contact with the working electrode as described above was superimposed, and additionally a lid of the holder was covered and tightened with a bolt, the holder was inserted into a transmission electron microscope body, an electron beam was emitted to the sample, and a TEM image in a liquid was acquired. The images acquired in the comparative example and the example are shown in FIG. 3 and FIG. 4.

Measurement Results

Figure 3:
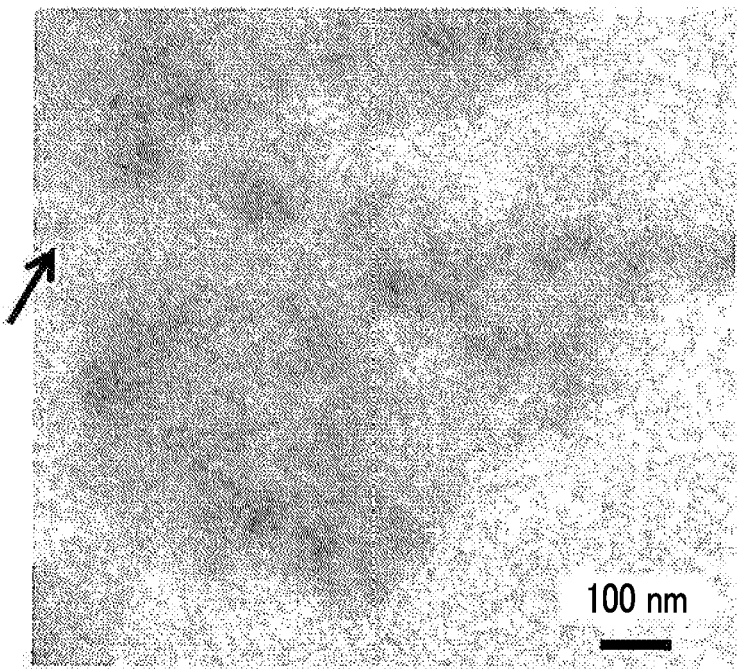
FIG. 3 is a transmission electron microscope image of a Pt sample obtained using a cell for electrochemical measurement of a comparative example.
Figure 4:
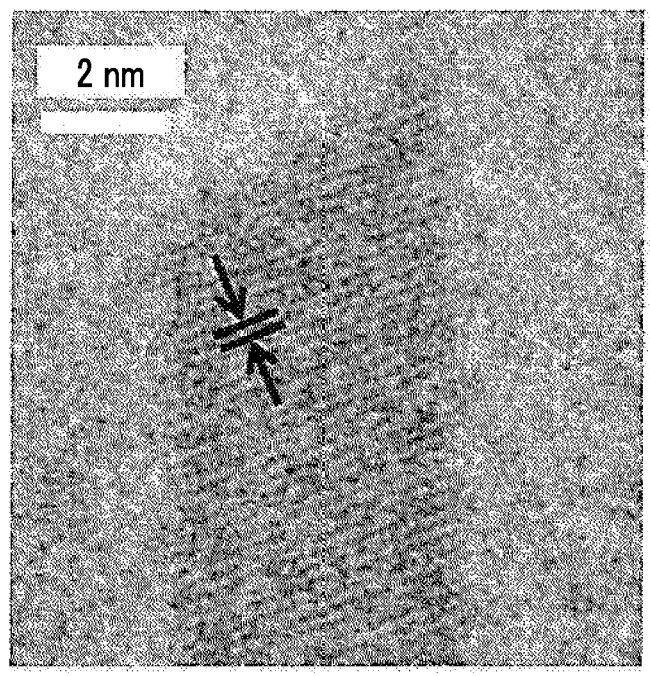
FIG. 4 is a transmission electron microscope image of a Pt sample obtained using a cell for electrochemical measurement of an example.
Figure 5:
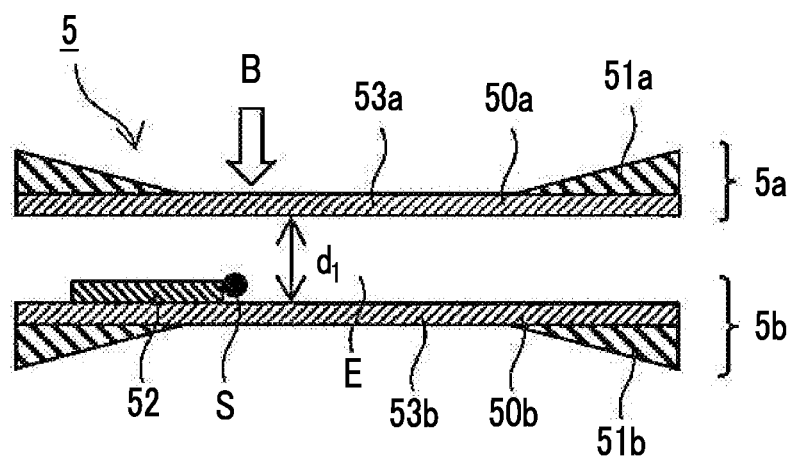
FIG. 5 is a cross-sectional view of an example (ideal state) of a cell for electrochemical measurement of the related art.
Figure 6:
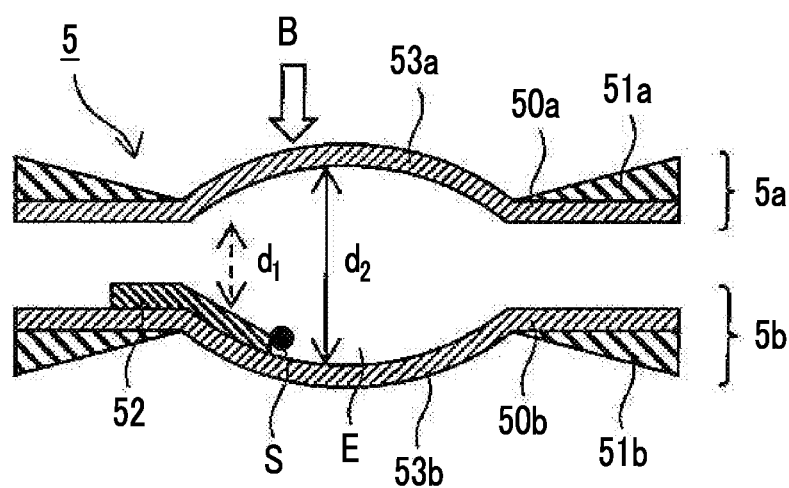
FIG. 6 is a cross-sectional view of an example (actual state) of a cell for electrochemical measurement of the related art.
Figure 7:
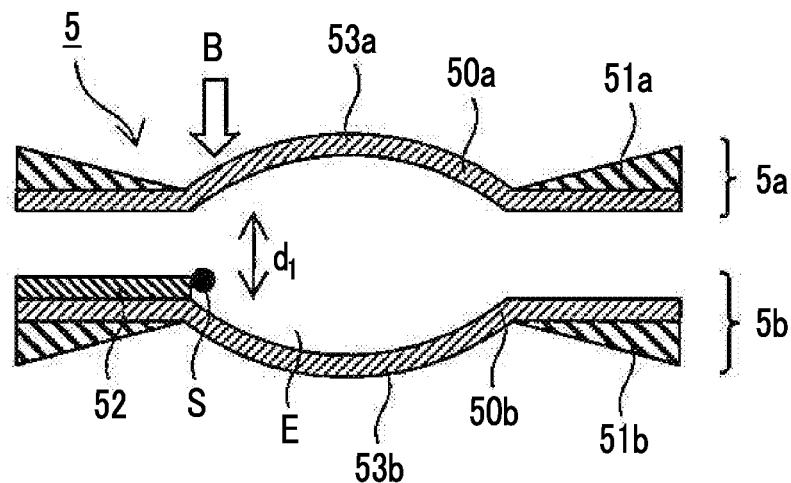
FIG. 7 is a cross-sectional view for explaining a problem of a cell for electrochemical measurement of the related art.
Figure 8:
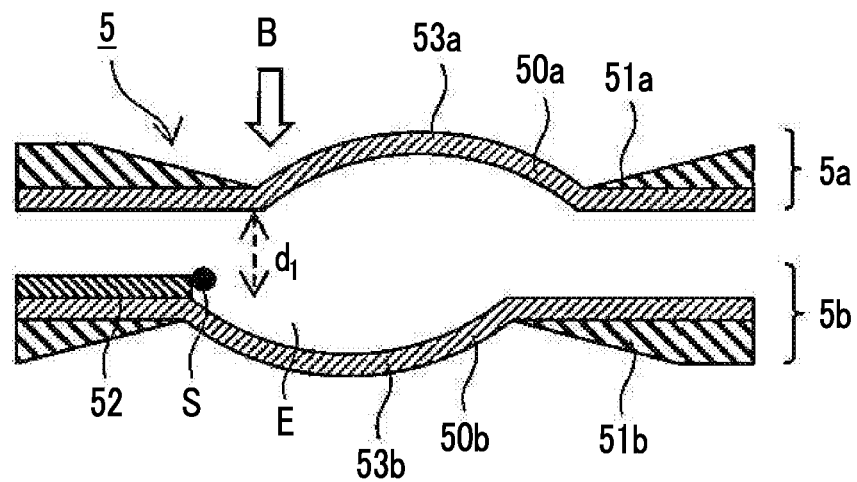
FIG. 8 is a cross-sectional view for explaining a problem of a cell for electrochemical measurement of the related art.

When the cell for electrochemical measurement of the comparative example including the working electrode without a plurality of through-holes was used, the thickness of the liquid layer at a position at which an electron beam was emitted was 700 nm, and a spatial resolution of the obtained TEM image was about a level at which blurred Pt nanoparticles with a size of 10 nm (arrow part) were able to be observed as shown in FIG. 3.

On the other hand, in the cell for electrochemical measurement of the example in which a Hall array electrode in which a plurality of through-holes were formed was used as the working electrode, the thickness of the liquid layer at a position at which an electron beam was emitted was able to be reduced to 150 nm, and as a spatial resolution of the TEM image, it was possible to resolve a distance between (111) lattice planes of Pt (0.22 nm) (arrow part), and it was possible to achieve a spatial resolution of an atomic level.

While the embodiments of the present disclosure have been described above in detail with reference to the drawings, specific configurations are not limited to the embodiments, and design modifications and the like in ranges not departing from the spirit and scope of the present disclosure are included in the present disclosure.

What is claimed is:

1. A cell for electrochemical measurement comprising:
a MEMS chip for observation; and
a MEMS chip for sealing, wherein:
the MEMS chip for observation includes a laminate including an electron-transmissive thin film and a substrate and in the MEMS chip for observation a working electrode and a counter electrode are provided on the thin film, and the MEMS chip for sealing is a laminate including an electron-transmissive thin film and a substrate, and the MEMS chip for observation and the MEMS chip for sealing are disposed apart from each other, and there are areas in both laminates in which the substrates are not present, and an observation window including the thin film is formed in the areas,
the working electrode overlaps the observation window in both laminates, and has a plurality of through-holes on the observation window in a direction in which an electron beam passes, and
an outer circumference of the through-holes of the working electrode is located at peripheral parts of the observation windows.

2. The cell for electrochemical measurement according to claim 1, wherein a planar shape of the through-holes on a plane perpendicular to a hole-axis direction of the through-holes is a circle.

3. The cell for electrochemical measurement according to claim 1, wherein a proportion of a total area of the plurality of through-holes in an external shape area of the working electrode on the plane perpendicular to the hole-axis direction of the through-holes is 10% to 90%.

4. The cell for electrochemical measurement according to claim 1, wherein the through-holes of the working electrode are located at a region in which the substrates of the laminates exist.

5. A MEMS chip for observation comprising:
a laminate including an electron-transmissive thin film and a substrate, wherein:
there is an area of the laminate in which the substrate is not present, and an observation window including the thin film is formed in the area,
a working electrode and a counter electrode are provided on the thin film and the working electrode overlaps the observation window and has a plurality of through-holes on the observation window, and
an outer circumference of the through-holes of the working electrode is located at a peripheral part of the observation window.

* * * * *